(12) United States Patent
Kojima et al.

(10) Patent No.: US 10,921,525 B2
(45) Date of Patent: Feb. 16, 2021

(54) GRATING COUPLER AND INTEGRATED GRATING COUPLER SYSTEM

(71) Applicants: Mitsubishi Electric Research Laboratories, Inc., Cambridge, MA (US); Mitsubishi Electric Corporation, Tokyo (JP)

(72) Inventors: Keisuke Kojima, Weston, MA (US); Mitsunobu Gotoda, Tokyo (JP); Toshiaki Koike-Akino, Belmont, MA (US); Mohammad Tahersima, DC, DC (US)

(73) Assignees: Mitsubishi Electric Research Laboratories, Inc., Cambridge, MA (US); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/260,747

(22) Filed: Jan. 29, 2019

(65) Prior Publication Data

US 2020/0174194 A1    Jun. 4, 2020

Related U.S. Application Data

(60) Provisional application No. 62/773,721, filed on Nov. 30, 2018.

(51) Int. Cl.
*G02B 6/34* (2006.01)
*G02B 6/293* (2006.01)
*G02B 6/12* (2006.01)

(52) U.S. Cl.
CPC ..... *G02B 6/29323* (2013.01); *G02B 6/12019* (2013.01); *G02B 6/34* (2013.01)

(58) Field of Classification Search
CPC ... G02B 6/29323; G02B 6/12019; G02B 6/34
See application file for complete search history.

(56) References Cited

U.S. PATENT DOCUMENTS

| | | | | |
|---|---|---|---|---|
| 5,070,488 A * | 12/1991 | Fukushima | ............ | G02B 6/124 359/571 |
| 5,436,991 A * | 7/1995 | Sunagawa | ............... | G02B 6/124 359/569 |
| 9,778,420 B2 * | 10/2017 | Shimizu | .................... | G02B 6/34 |
| 2004/0156589 A1 * | 8/2004 | Gunn, III | ........... | G02B 6/12004 385/37 |
| 2004/0165637 A1 | 8/2004 | Bullington et al. | | |
| 2006/0120667 A1 * | 6/2006 | Reed | .................. | G02B 6/12002 385/37 |

(Continued)

*Primary Examiner* — Ellen E Kim
(74) *Attorney, Agent, or Firm* — Gennadiy Vinokur; James McAleenan; Hironori Tsukamoto

(57) ABSTRACT

A grating coupler having first and second ends for coupling a light beam to a waveguide of a chip includes a substrate configured to receive the light beam from the first end and transmit the light beam through the second end, the substrate having a first refractive index n1, a grating structure having curved grating lines arranged on the substrate, the grating structure having a second refractive index n1, wherein the curved grating lines have line width w and height d and are arranged by a pitch Λ, wherein the second refractive index n2 is less than first refractive index n1, and a cladding layer configured to cover the grating structure, wherein the cladding layer has a third refractive index n3.

14 Claims, 23 Drawing Sheets

(56) References Cited

U.S. PATENT DOCUMENTS

| | | | |
|---|---|---|---|
| 2009/0003762 A1* | 1/2009 | Chiniwalla | G02B 6/1228 |
| | | | 385/14 |
| 2014/0153601 A1* | 6/2014 | Doerr | H01S 5/125 |
| | | | 372/44.01 |
| 2014/0314374 A1 | 10/2014 | Fattal et al. | |
| 2017/0168209 A1* | 6/2017 | Shin | G02B 30/00 |
| 2017/0207600 A1* | 7/2017 | Klamkin | H01S 5/02292 |

* cited by examiner

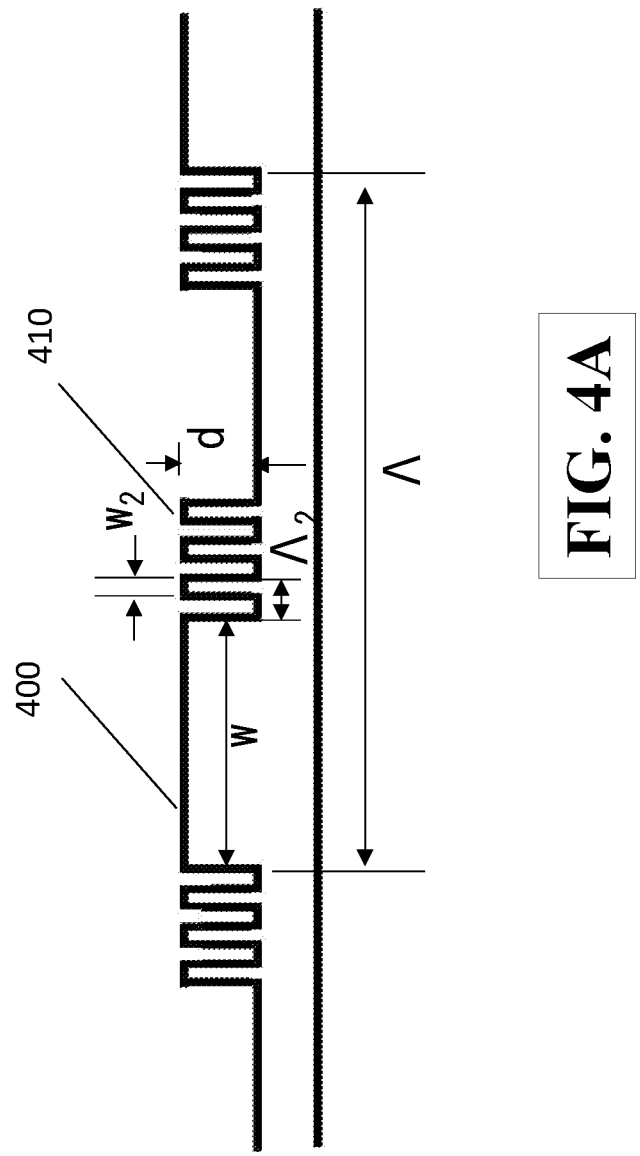

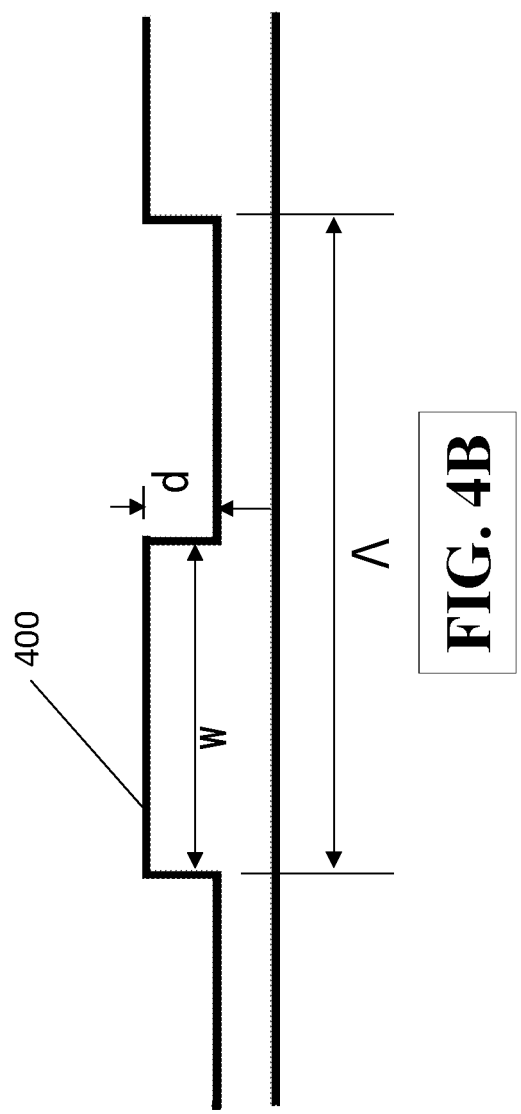

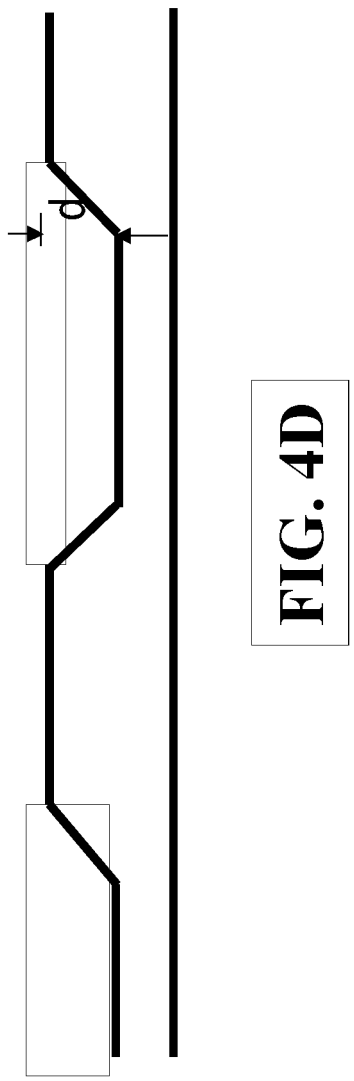

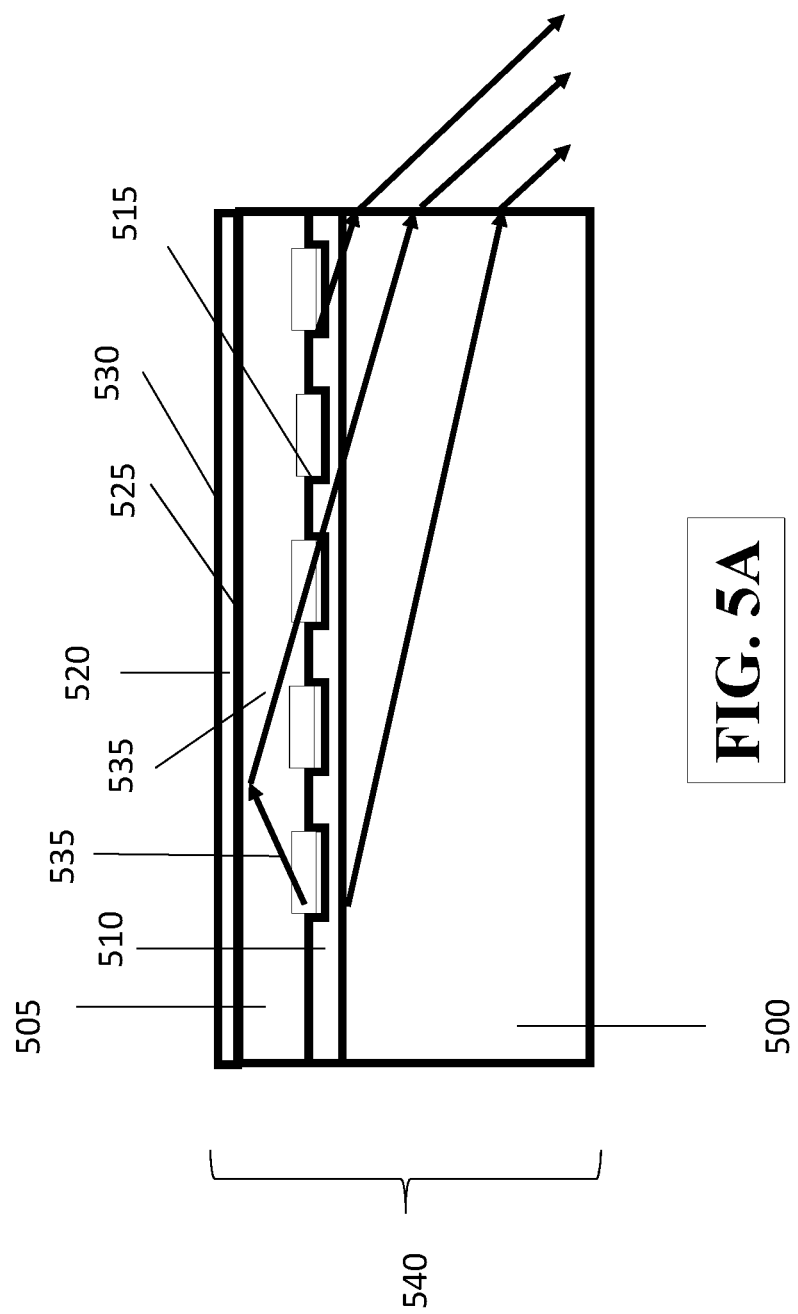

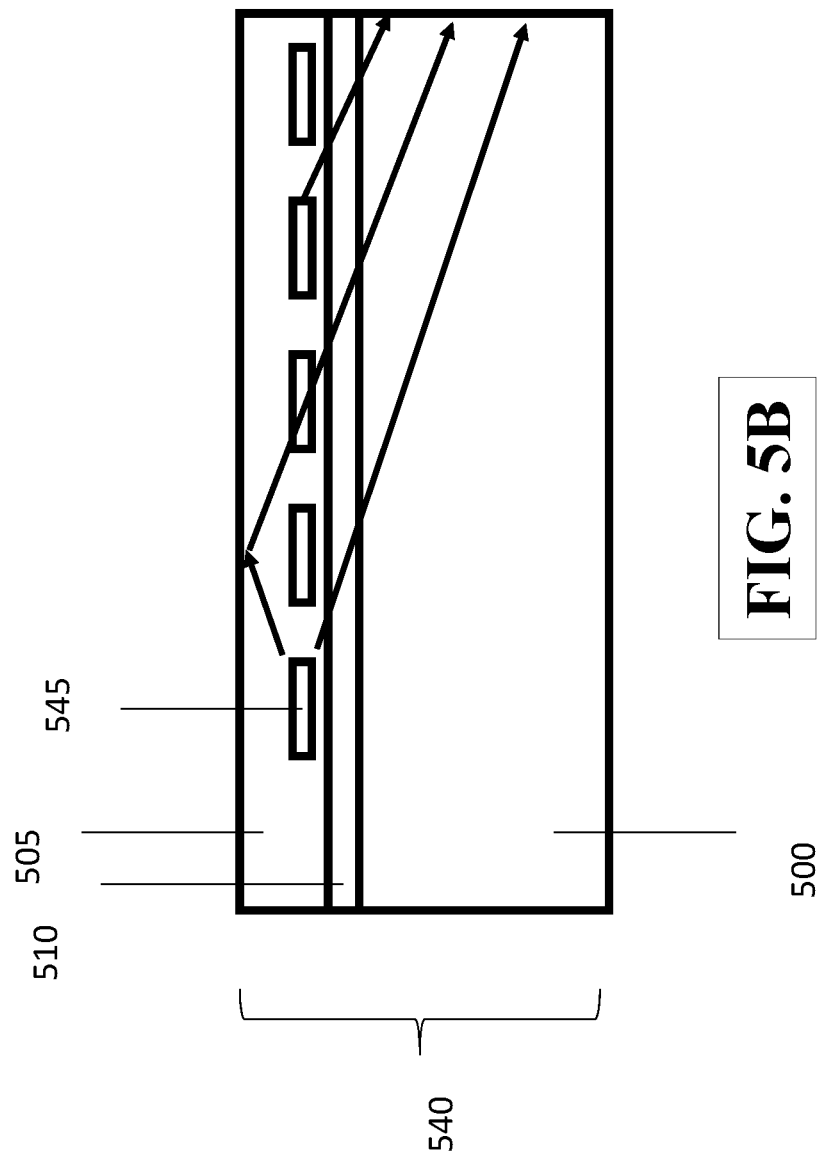

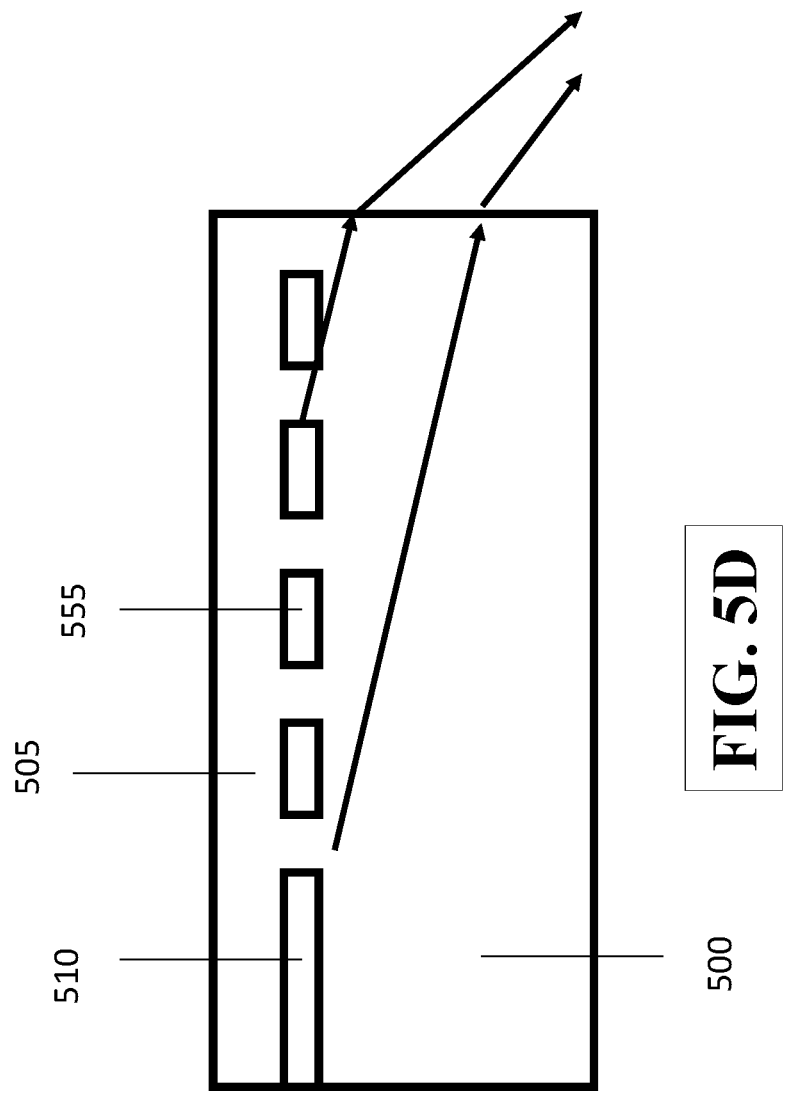

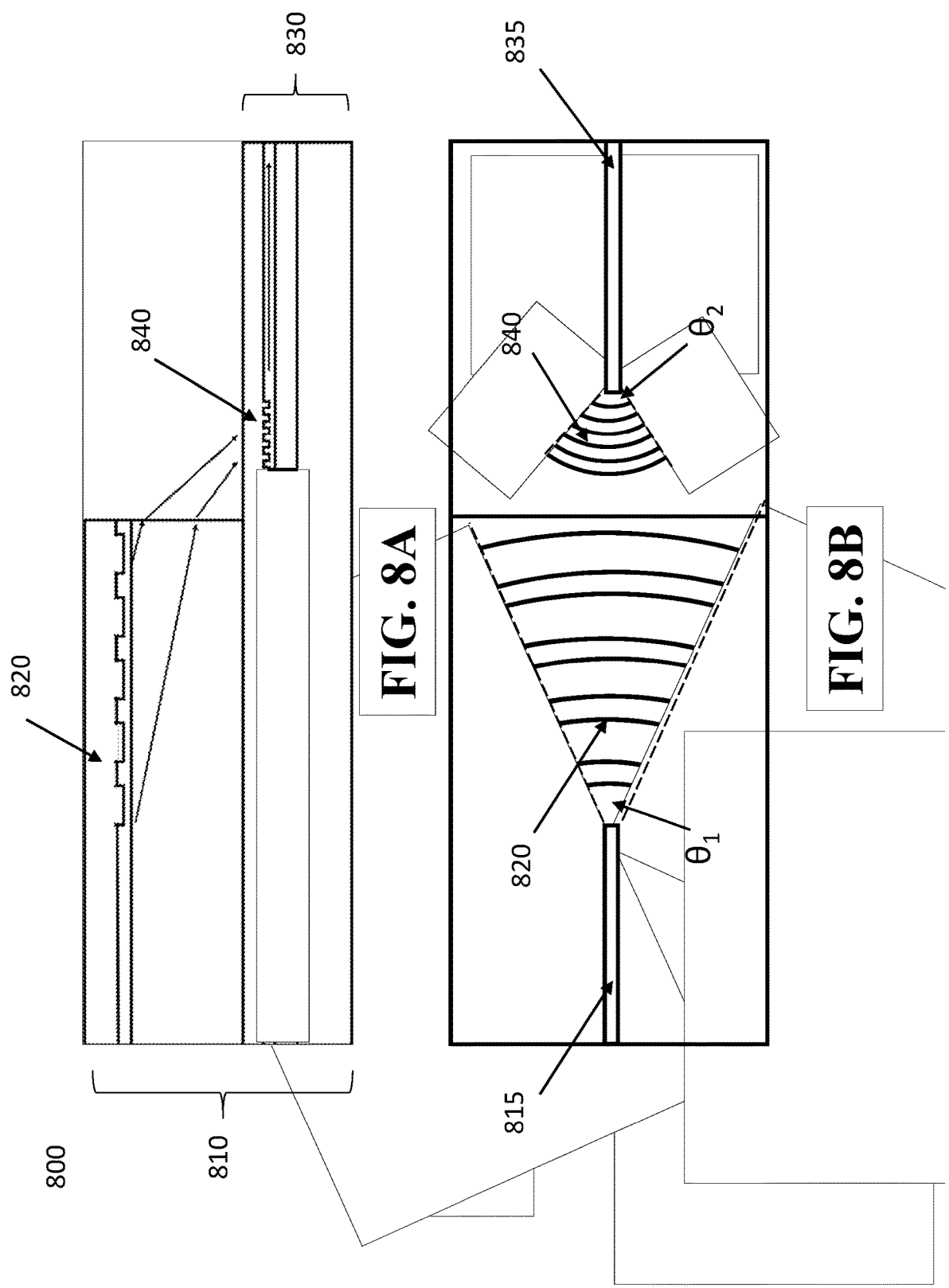

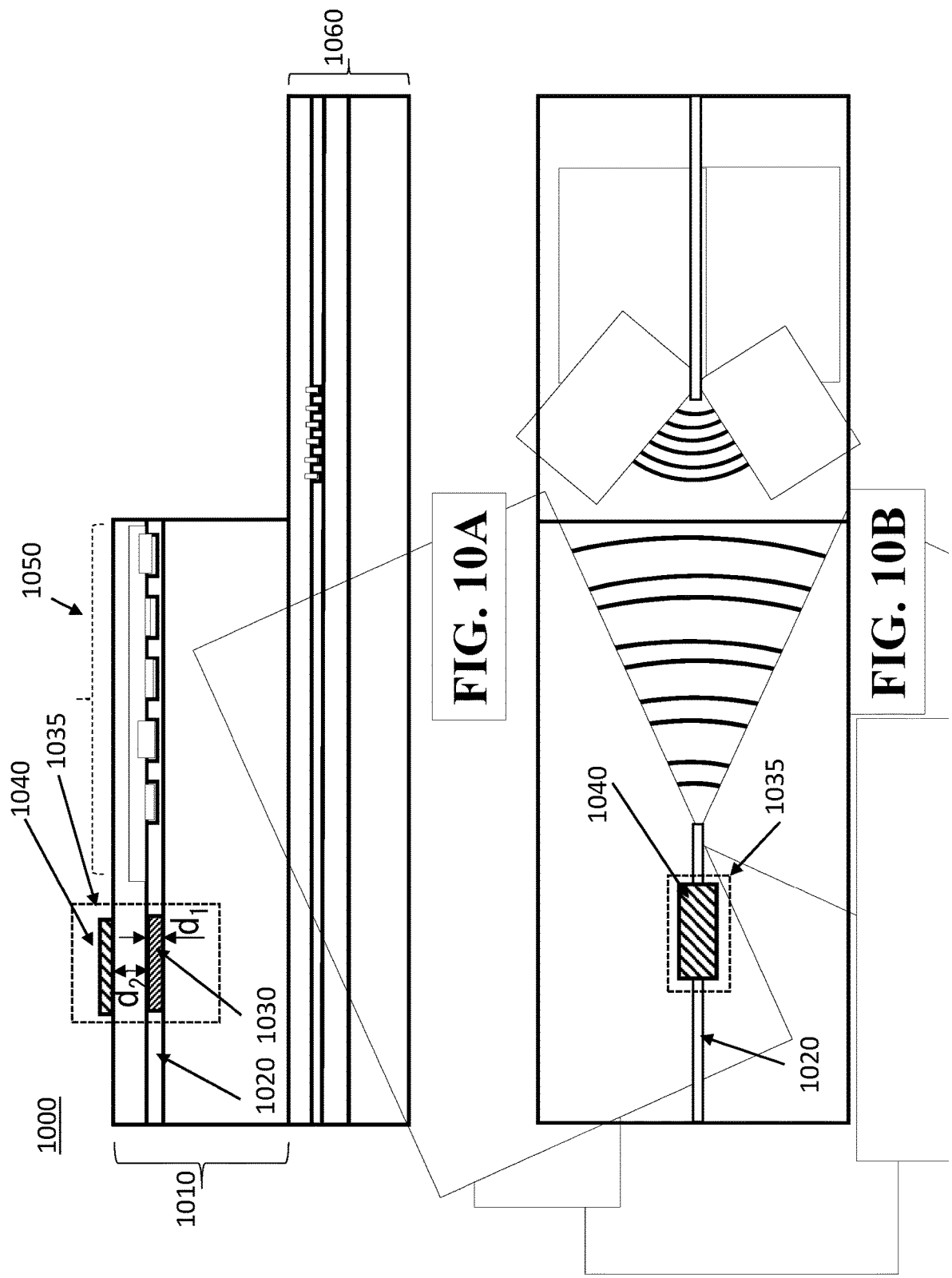

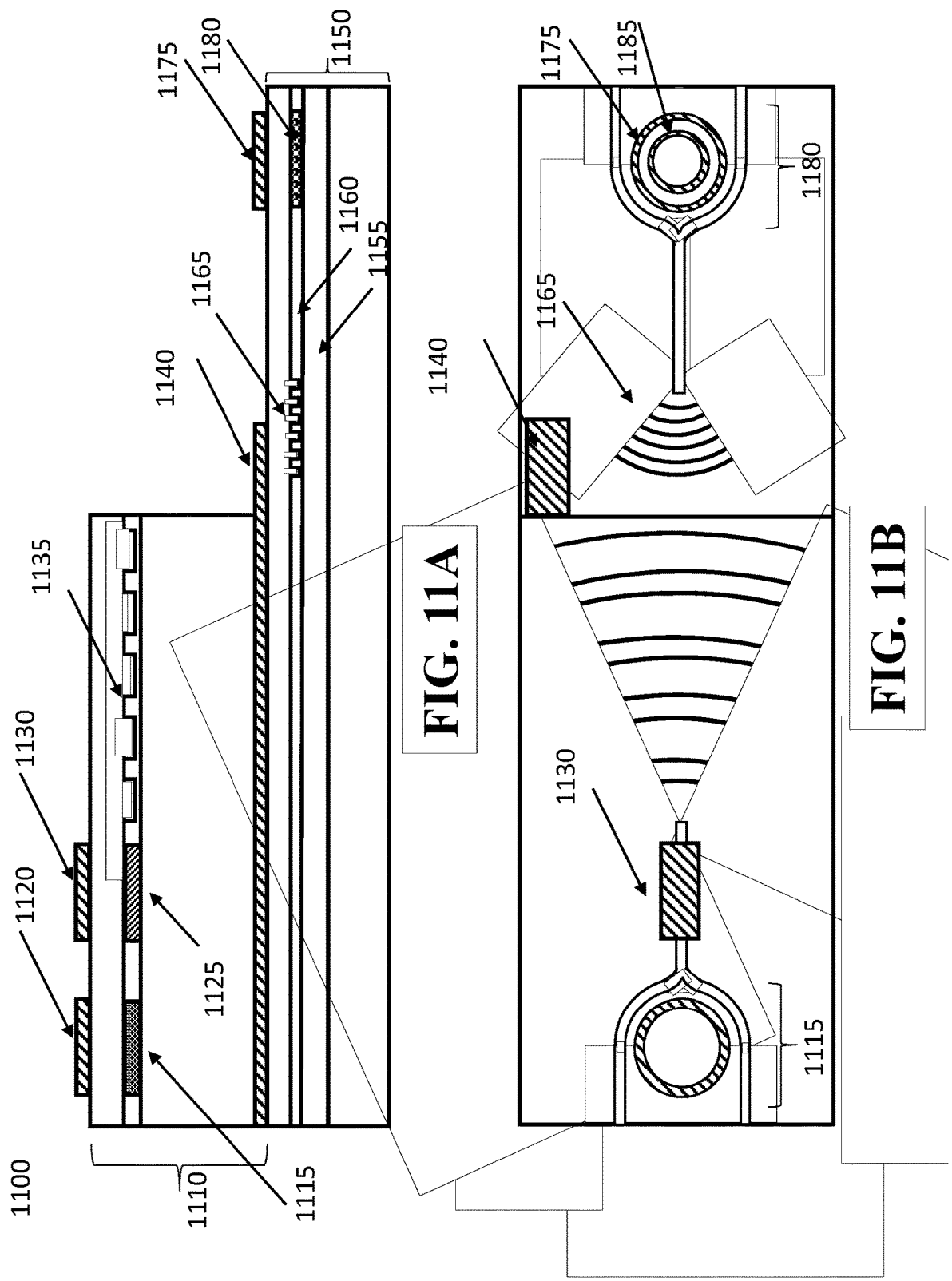

GRATING COUPLER AND INTEGRATED GRATING COUPLER SYSTEM

FIELD OF THE INVENTION

This invention generally relates to grating couplers for optical chips, also called photonic integrated circuits (PICs), and more particularly to grating coupler system connecting one active chip and one passive optical chip.

BACKGROUND OF THE INVENTION

The target application is a hybrid integration of an active optical chip such as one containing InP waveguides and a passive chip such as one containing silicon and/or silicon nitride waveguides. The expected properties are, large tolerance to mis-alignment, easiness of bonding processes, and high coupling efficiency.

Silicon photonics offer many advantages of which the fabrication cost is the most important factor. Furthermore, high refractive index contrast between the silicon waveguide and the surrounding silicon dioxide layers offer tight bending with low loss possible, leading to higher density and complexity PICs. Silicon nitride waveguides offer similar low cost capabilities, with lower optical loss property. On the other hand, there is no reliable optical gain or emission capability with direct current injection. Therefore, hybrid integration of active PICs (such as InP, GaAs, or GaN-based ones) with passive silicon photonics PICs become very important to achieve low cost, full functionality, and high density PICs.

However, optically connecting two waveguides precise requires precise alignment typically with sub-micron accuracy, due to narrow waveguides and thus fast diverging beam on both sides. There is a need to connect two optical chips with larger tolerance with high coupling efficiency.

SUMMARY OF THE INVENTION

Some embodiments of the present disclosure are based on recognition that long period grating on a passive waveguide from an optical chip creates shallow angle emission towards the substrate side, diffracted at the chip facet (second end) at a steeper angle, and the coupled to the passive optical chip through a grating coupler.

In accordance to some embodiments, a novel grating coupler system is realized by a grating coupler having first and second ends for coupling a light beam to a waveguide of a chip including a substrate configured to receive the light beam from the first end and transmit the light beam through the second end, the substrate having a first refractive index $n1$; a grating structure having grating lines arranged on the substrate, the grating structure having a second refractive index $n2$, wherein the grating lines have line width $w$ and height $d$ and are arranged by a pitch $\Lambda$, wherein the second refractive index $n2$ is greater than first refractive index $n1$; and a cladding layer configured to cover the grating structure, wherein the cladding layer has a third refractive index $n3$, wherein the third refractive index $n3$ is less than the second refractive index $n2$, wherein the cladding layer is arranged so as to reflect the light beam diffracted from the grating structure toward below the cladding layer.

Further, another embodiment of the present invention is based on recognition that an integrated grating coupler system includes a grating coupler formed on a first chip, the grating coupler having first and second ends for coupling a light beam to a waveguide of a second chip, wherein the grating coupler comprises a substrate configured to receive the light beam from the first end and transmit the light beam through the second end, the substrate having a first refractive index $n1$; a grating structure having grating lines arranged on the substrate, the grating structure having a second refractive index $n2$, wherein the grating lines have line width $w$ and height $d$ and are arranged by a pitch $\Lambda$, wherein the second refractive index $n2$ is greater than first refractive index $n1$; and a cladding layer configured to cover the grating structure, wherein the cladding layer has a third refractive index $n3$, wherein the third refractive index $n3$ is less than the second refractive index $n2$; and a gain region connected to the first end of the grating coupler either directly or through a waveguide, wherein the laser structure comprises a substrate identical to a substrate of the grating coupler; an active layer having a first thickness $d1$, the active layer being arranged on the substrate, wherein the active layer is connected to the grating structure of the grating coupler; and a cladding layer arranged on the active layer, the cladding layer having a second thickness $d2$ is connected to the cladding layer of the grating coupler.

Yet further, according to another embodiment of the present invention, an integrated grating coupler system includes a grating coupler formed on a first chip, the grating coupler having first and second ends for coupling a light beam to a waveguide of a second chip, wherein the grating coupler comprises: a substrate configured to receive the light beam from the first end and transmit the light beam through the second end, the substrate having a first refractive index $n1$; a grating structure having grating lines arranged on the substrate, the grating structure having a second refractive index $n2$, wherein the grating lines have first line width $w1$ and first height $d1$ and are arranged by a first pitch $\Lambda1$, wherein the second refractive index $n2$ is greater than first refractive index $n1$; a cladding layer to cover the grating structure, wherein the cladding layer has a third refractive index $n3$, wherein the third refractive index $n3$ is less than the second refractive index $n2$; and a laser structure connected to the first end of the grating coupler, wherein the laser structure comprises a substrate identical to a substrate of the grating coupler; an active layer to emit the light beam to the grating coupler, the active layer having a first thickness $d1$ and a fifth refractive index $n4$, the active layer being arranged on the second substrate, wherein the active layer is connected to the grating structure of the grating coupler; a laser-cladding layer arranged on the active layer, the laser-cladding layer having a second thickness $d2$ and a sixth refractive index $n5$ is connected to the cladding layer of the grating coupler; and first and second electrodes to apply a voltage through the laser structure; and a waveguide device to mount the grating coupler and the laser structure, wherein the waveguide device comprises a first cladding layer connected to bottoms of the grating coupler and the laser structure the first cladding layer having a seventh refractive index $n7$; a waveguide structure having a second grating structure, wherein the second grating structure includes second grating lines arranged in part of the waveguide structure to couple a laser beam from the grating coupler to the waveguide structure, the waveguide structure having a eighth refractive index $n8$, wherein the grating lines have second line width $w2$ and second height $d2$ and are arranged by a second pitch $\Lambda2$, wherein the eighth refractive index $n8$ is greater than seventh refractive index $n7$; and a waveguide substrate connected to the waveguide structure, the waveguide substrate having a ninth refractive index $n9$, wherein the ninth refractive index $n9$ is less than the eighth refractive index $n8$.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 4A shows this invention containing sub-gratings;

FIG. 4B shows the conventional gratings without sub-gratings;

FIG. 4D shows a grating shape wherein both edges are slanted;

FIG. 5A shows a cross-sectional view of a grating etched directly onto the waveguide layer, with an optional dielectric film on the cladding layer;

FIG. 5B shows a cross-sectional view of a grating above the waveguide layer;

FIG. 5D shows a cross-sectional view of a grating made of separated segments of a waveguide layer;

FIG. 8A show the cross-section view of the grating coupler system, wherein the grating lines are curved;

FIG. 8B shows the top view of the grating coupler system of FIG. 8A, wherein the grating lines are curved. $θ_1$ and $θ_2$ are the angles for the concentric grating lines for the first and second chips, respectively;

FIG. 10A shows a cross-sectional view of a grating coupler system, wherein a gain section, or a laser section (DFB or DBR laser) is attached to the first end;

FIG. 10B shows a top view of a grating coupler system of FIG. 10;

FIG. 11A shows a cross-sectional view of a grating coupler system configured as a tunable laser with an optical chip with a grating coupler integrated with an active section and wavelength selective reflector, attached on a second optical chip with a grating coupler and a wavelength selective reflector; and FIG. 11B shows a top view of a grating coupler system of FIG. 11A.

DETAILED DESCRIPTION OF THE PREFERRED EMBODIMENTS

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Furthermore, embodiments of the subject matter disclosed may be implemented, by use of at least in part, or combinations of parts of the structures described below.

Overview of Embodiments of the Present Disclosure

Optical coupling between two optical chips constitute the most important part of hybrid PICs. The easiness of alignment and high coupling efficiency are very important factors. Grating couplers offer these capabilities.

There are multiple factors in achieving high coupling efficiency for this configuration.

Figure 1:
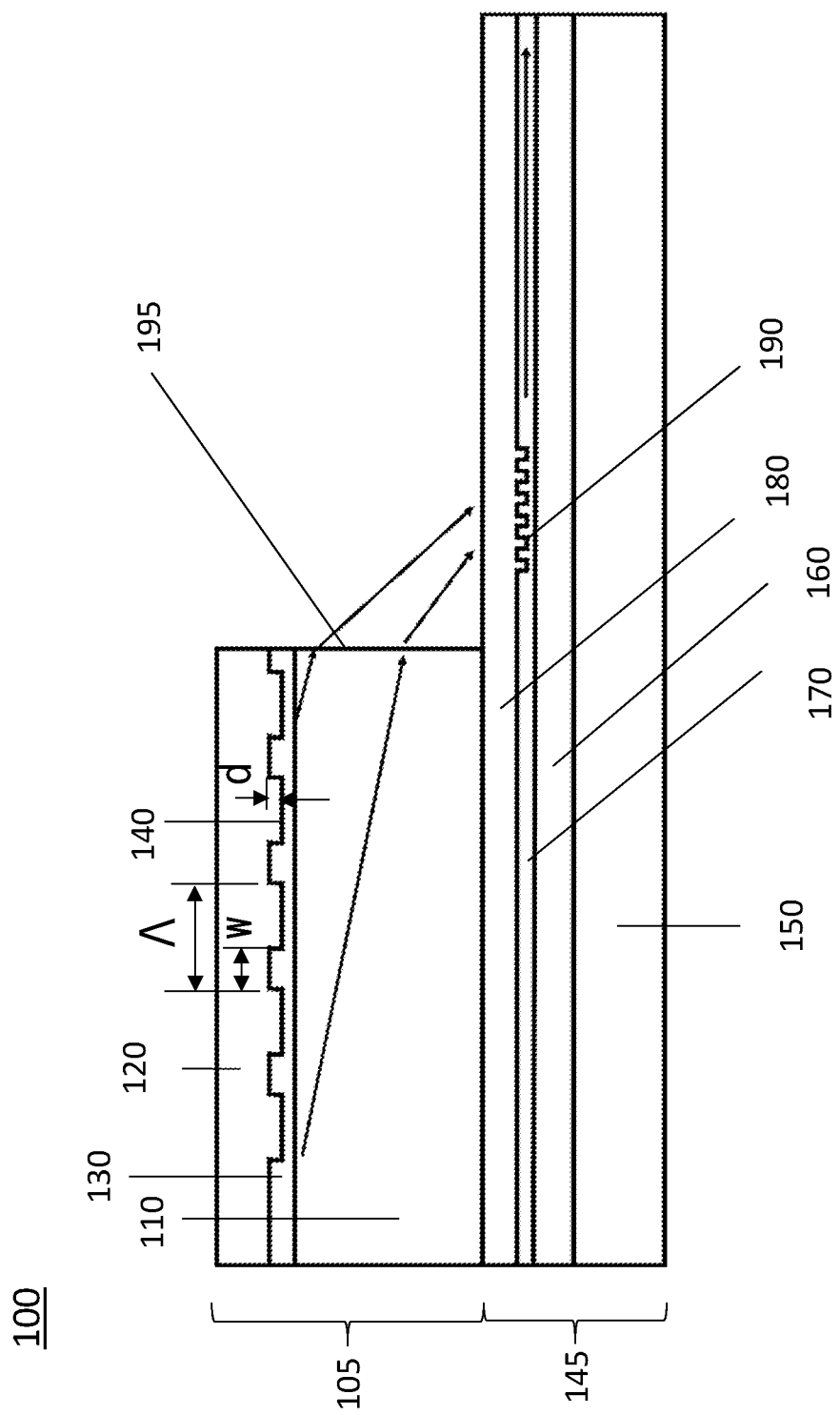
FIG. 1 shows a cross-sectional view of the integrated grating coupler system according to the invention.

FIG. 1 shows a cross-sectional view of the integrated grating coupler system 100 according to the invention. The first optical chip (first chip) 105 is made on an InP substrate 110, containing an InGaAsP waveguide layer 130, InP cladding layer 120, and a first grating 140. The second optical chip (second chip) 145 comprises of a silicon substrate 150, a buried $SiO_2$ layer (also called a BOX layer) 160, a silicon (Si) waveguide layer (also called silicon-on-insulator, or SOI) 170, and a $SiO_2$ cladding layer 180, and the second grating 190 etched onto the silicon waveguide layer. The diffracted light in the first optical chip 105 propagates through the InP substrate 110 and the first optical chip facet 195, and is coupled into the grating 190 on the second optical chip 145.

Here, the grating pitch Λ is the distance between the rising edges of the grating, w is the line width of the main tooth, and d is the thickness of the grating. In the first optical chip, grating diffracts light towards the substrate as a shallow angle, which is further diffracted at the chip fact to a steeper angle. The light is focused on the grating in the second chip and is guided to its waveguide. The operating wavelength of 1530-1570 nm, the typical grating pitch Λ is 5-15 μm, and the typical grating line width w is 10-60% of the grating pitch, depending on whether sub-gratings are included, or how the sub-gratings are designed. The typical grating thickness d is 0.2-1 μm.

Figure 2A:
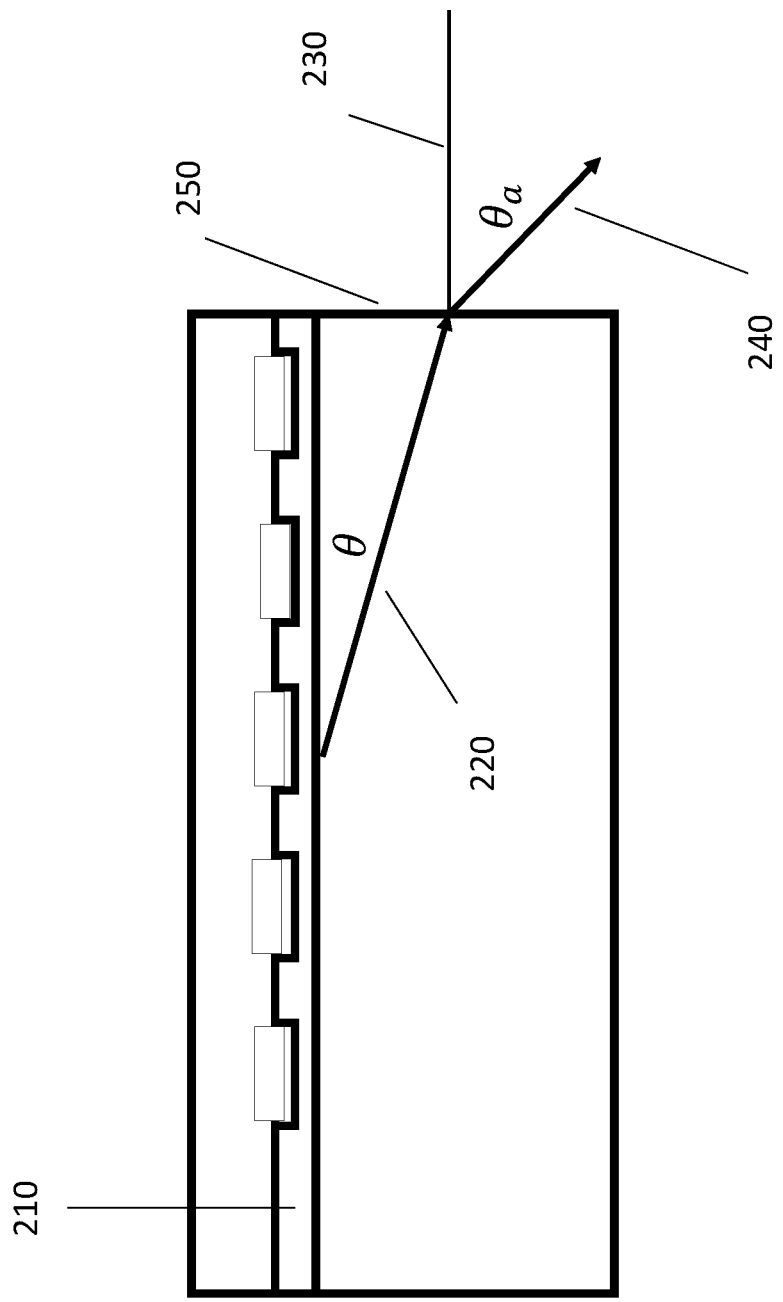
FIG. 2A show the definition of two angles θ and $θ_α$.

FIG. 2A show the definition of θ and θ$_α$, wherein θ is the angle between the InGaAsP waveguide layer 210 and the diffracted light 220, and θ$_α$ is the angle between the facet normal 230 and the diffracted light 240 passing through the facet 250.

Figure 2B:
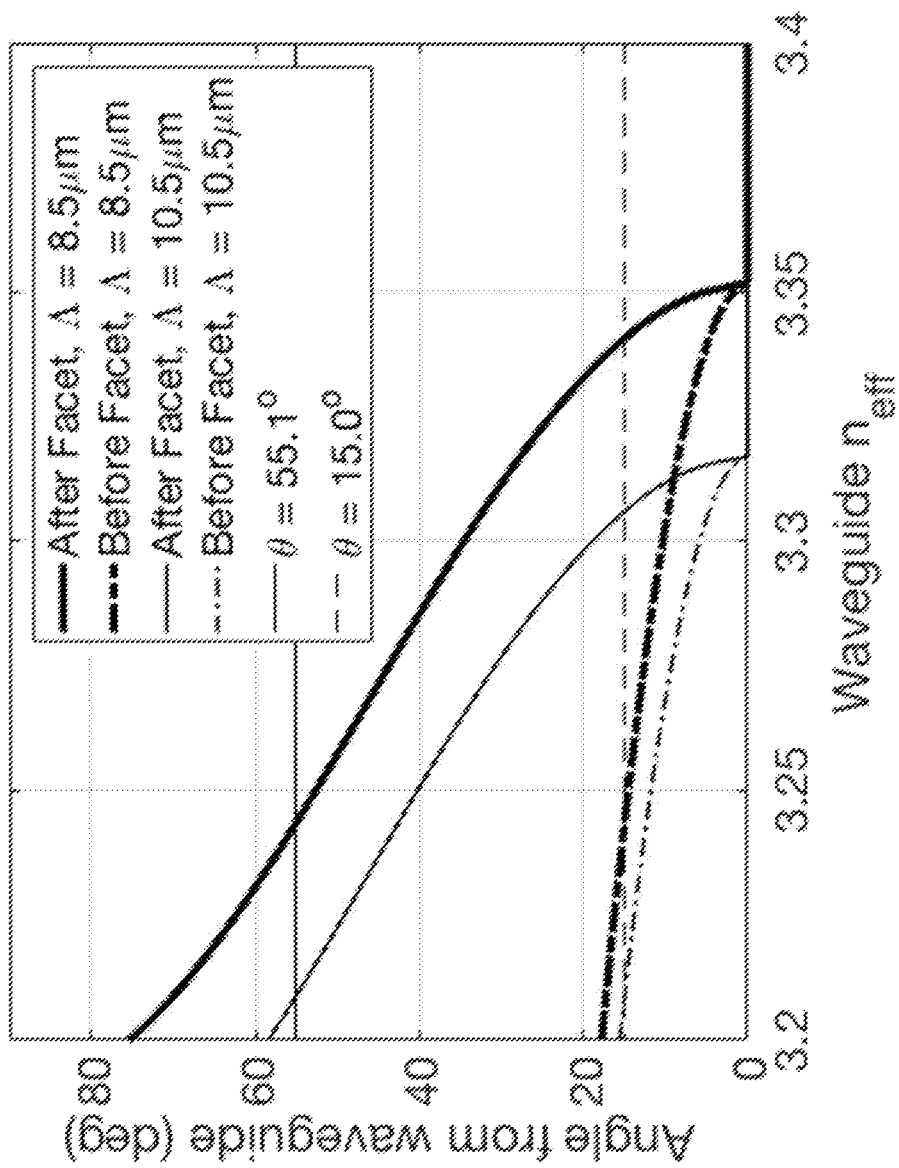
FIG. 2B shows the calculated relationship between the waveguide effective refractive index and the diffracted light angles.

FIG. 2B shows the relationship between the waveguide effective refractive index and the diffracted light angle θ and θ$_α$, before and after facet diffraction, respectively.

The relationship between the diffraction angle, refractive indices, and the grating pitch can be expressed as, $$k_0 n_{eff} - n_s \cos\theta = m\frac{2\pi}{\Lambda}$$

where Λ is the pitch of the grating, k$_0$=2π/λ is the wave vector in vacuum, λ is the wavelength in vacuum, n$_{eff}$ is the effective refractive index of the waveguide, n$_s$ is the refractive index of the substrate, θ is the angle between the propagation direction within the waveguide and the diffraction angle as defined in FIG. 2A, and m is the order of diffraction. From practical point of view, first-order grating usually offers the highest coupling efficiency, so m=1 is used in this invention.

The angle between the diffracted light into the air from the facet and the original waveguide propagation angle (facet normal) θ$_{60}$ as defined in FIG. 2B can be expressed as, $$n_s \sin\theta = \sin\theta_\alpha$$

The diffraction angle from the grating in the first optical chip has to be in a certain range, typically 10° and 20° within the optical chip. If it is below 10°, the diffraction light from the chip facet is also shallow (less than ~33°), and coupling to a second optical chip makes less efficient. On the other hand, if the emission angle is more than 20°, most of the light is reflected at the chip facet, making the coupling very inefficient. Therefore, it is important to keep the diffraction angle between 10 and 20 degrees. Assuming n$_s$=3.169 for a typical InP at the wavelength of 1550 nm, n$_{eff}$=3.244, and Λ=8.5 μm, we obtain θ=15.0° and θ$_α$=55.1°.

FIG. 2B shows a plot of diffracted angles before and after the facet from the original propagation direction (i.e., facet normal), with two grating pitches, i.e., Λ=8.5 μm and Λ=10.5 μm are used. Depending on the pitch of the grating, there is an optimal waveguide effective refractive index. In other words, the grating pitch typically needs to be between 5 μm and 15 μm.

Figure 3A:
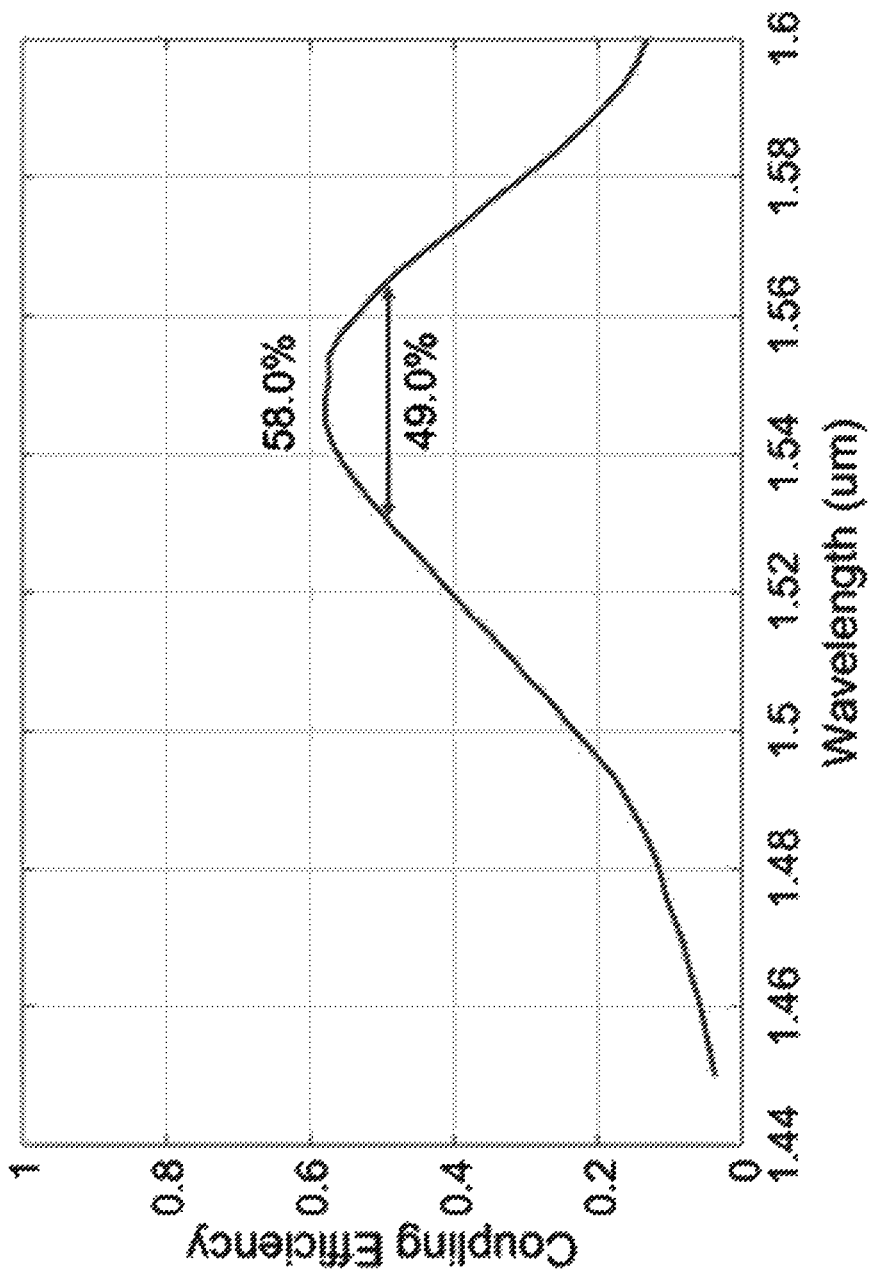
FIG. 3A shows the simulated coupling efficiency between the two optical chips as a function of wavelength.

FIG. 3A shows the simulated coupling coefficient as a function of wavelength. The structural parameters are optimized such that the coupling coefficient for the wavelength range of 1530-1565 nm is maximized. The simulated coupling coefficient is 58.0% (−2.4 dB) at the peak, and >49% for the wavelength range of 1530-1565 nm.

The optimized structure and the parameters are as follows. The InP side structure consists of 80 μm-thick InP substrate, 0.5 μm-thick InGaAsP (bandgap: 1.30 μm), 0.3 μm-deep etched grating, 0.47 μm-thick InP upper cladding layer, and 20 nm-thick SiO2 passivation layer. The length of the InP grating section is 200 μm. In order to achieve shallow diffraction angle (15.0° within InP and 55.1° in the air) the initial pitch of the main grating in the left hand size is 8.5 μm. Further, in order to achieve focusing effect, the grating pitch is varied as a function of distance (linear pitch reduction: 0.1 μm per period). The grating has main teeth (width is 28% of the pitch) and 3 periods of sub-gratings with 210 nm width and 220 nm spacing on each side of the main teeth. Sub-gratings are gratings whose period is smaller than the main grating. The grating is also apodized in that the width of the etched part is linearly shrunk for each period. The facet has a pair of SiO$_2$ and Si$_3$N$_4$ coating. In the silicon side, we used two pairs (Si/SiO$_2$) of distributed Bragg reflectors (DBR) under the silicon waveguide. The 0.22 μm-thick silicon waveguide is sandwiched between a 2.1 μm-thick SiO$_2$ lower cladding layer and a 1.04 μm-thick SiO2 upper cladding layer. The silicon grating depth is 87.5 nm. The length of the silicon grating section, starting from the end of the InP chip, is 32 μm. The silicon grating is apodized but does not have chirp.

Figure 3B:
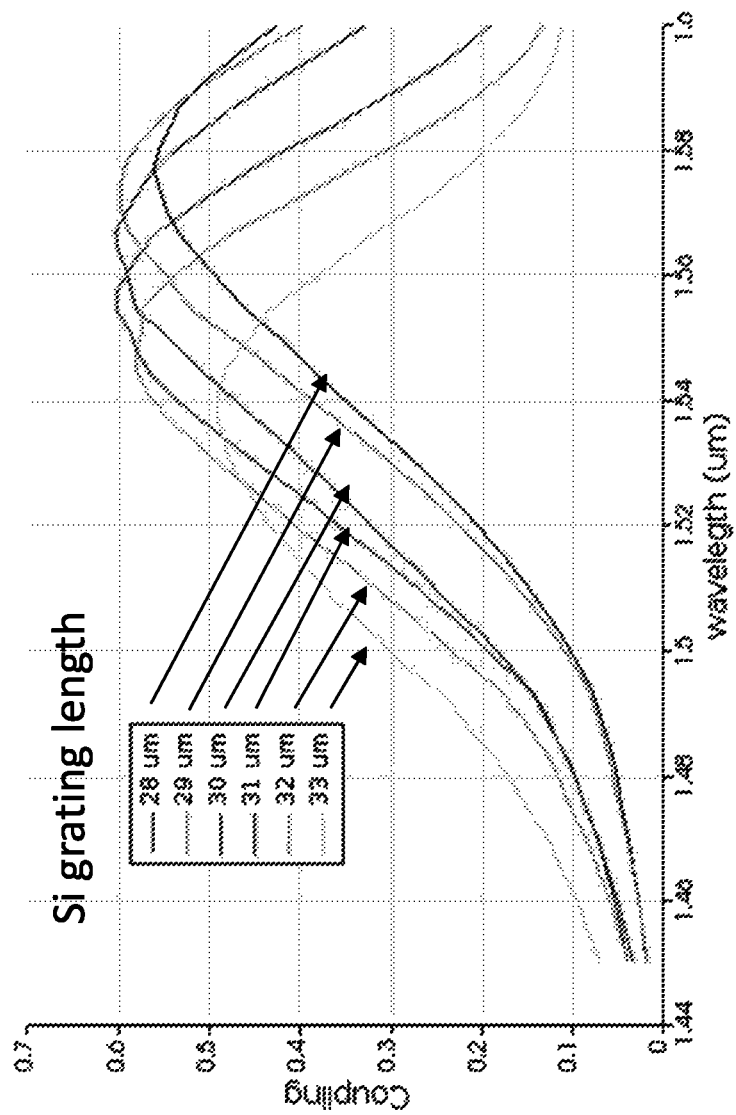
FIG. 3B shows the simulated coupling efficiency with different silicon grating length (positions)

FIG. 3B shows the simulated coupling efficiency when the silicon grating section length (i.e., the endpoint measured from the edge of the InP chip facet). When the wavelength is at 1560 nm, the coupling efficiency changed within ±5% when the length changed by ±1.5 μm (29-32 μm). This is in contrast to typical chip-to-chip direct coupling, where sub-micron alignment accuracy is required.

Grating diffracts light in multiple direction corresponding to the Fourier component of the diffraction grating. For example, third and fifth order diffraction, which do not contribute to the coupling efficiency, are related to the third and fifth order component of the grating. Therefore, it is important to reduce those components by effectively smoothing the grating. Sub-gratings, whose line width w$_2$ and pitch Λ$_2$ are much smaller than w and Λ, respectively, can be added on at least one side of the main (primary) grating (FIG. 4A). The typical w$_{eff}$/Λ is 0.4-0.6. the typical sub-grating line width w$_2$ is 0.02-0.3 μm, and typical sub-grating pitch Λ$_2$ is 0.04-0.6 μm, Also, the second Fourier component needs to be minimized. The duty cycle (w/Λ), needs to be close to 0.5 in the case of a primary grating without sub-gratings (FIG. 4B). In the case of FIG. 4A, the effective duty cycle, w$_{eff}$/Λ, where w$_{eff}$ is the effective line width of the grating, i.e., adding w of the main grating and cumulative w$_2$ from all the subgratings.

Figure 4C:
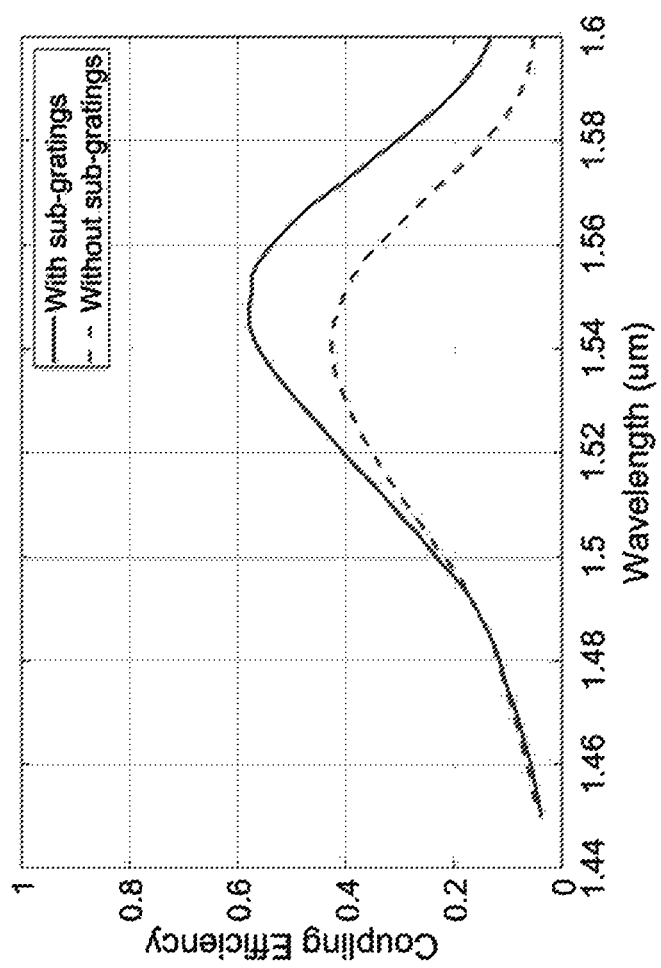
FIG. 4C shows the simulated coupling efficiency with and without sub-gratings.

FIG. 4C shows the simulated coupling efficiency with and without sub-gratings, wherein the duty cycle is optimized in each case. It is clearly shown that sub-gratings show much higher coupling efficiency due to reduced diffraction in unnecessary directions.

The grating geometry does not necessarily have to be rectangular. Third and fifth-order diffraction can also be suppressed by incorporating gratings with slanted edges, such as shown in FIG. 4D.

Figure 4E:
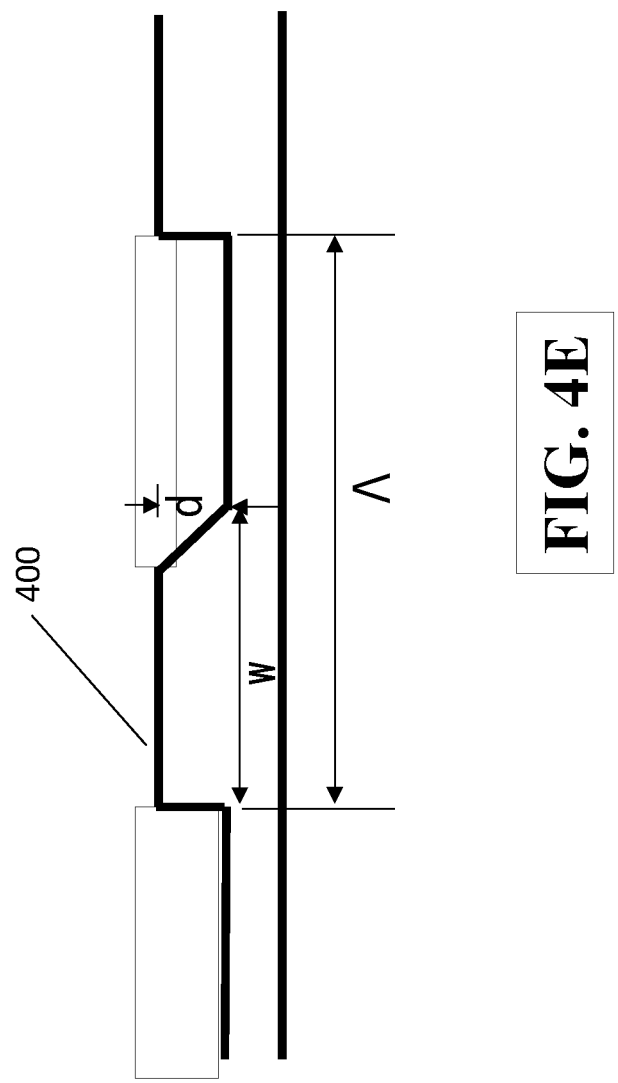
FIG. 4E shows a grating shape wherein a slanted edge is on one side.
Figure 4F:
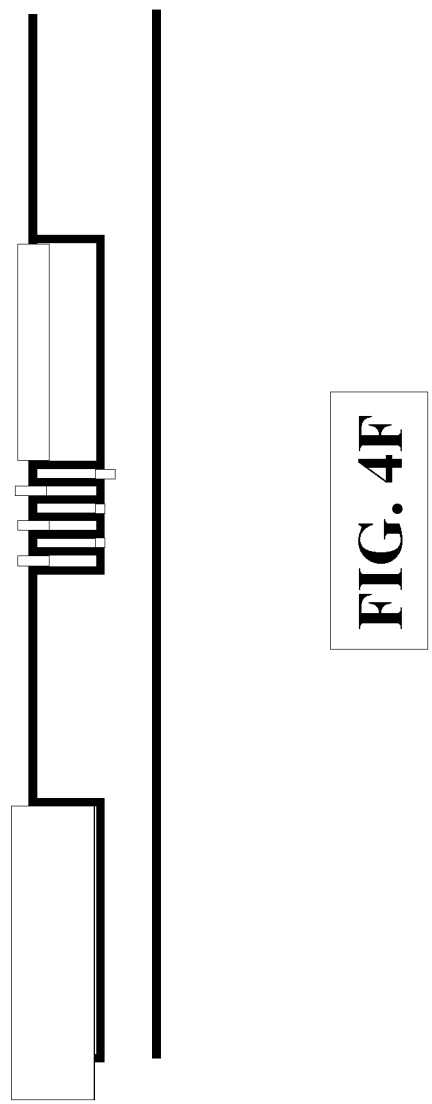
FIG. 4F shows a grating with sub-gratings on one side.
Figure 4G:
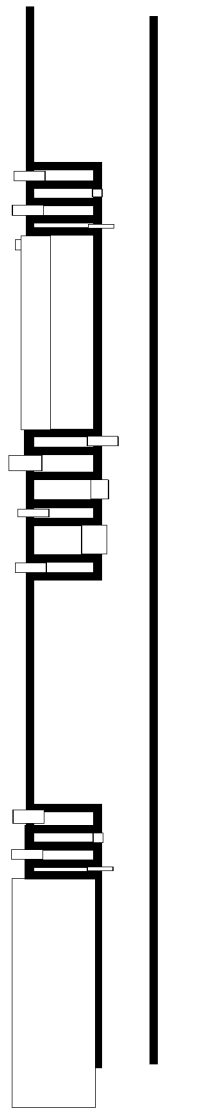
FIG. 4G shows a grating with sub-gratings with varied width and/or spacing.

Suppressing the upward diffraction also increases downward diffraction which more efficiently couples into the grating on the second chip. This can be achieved by slanting one of the edge of the gratings as shown in FIG. 4E, incorporating sub-gratings on one side of the grating (FIG. 4F), or asymmetric sub-grating on each side of the grating (FIG. 4G).

FIG. 5A shows an example of the grating coupler of the first optical chip 540, wherein the grating 515 is etched into the InGaAsP waveguide layer 515 in the second refractive index, and is surrounded by an InP substrate 500 and an InP cladding layer 505 both of the first refractive index. This first optical chip can optionally have a SiO$_2$ or Si$_3$N$_4$ dielectric layer 520 on top of an InP cladding layer 505. The grating 515 typically diffracts light in both upward and downward directions with similar intensity. Because of the shallow emission angle (10°-20°) in the first optical chip 540, the upward diffracted light 535 is very efficiently reflected either at the cladding layer—dieletric layer interface 525, or at the dielectric—air interface 530, and it is important not to disturb the surface. Therefore, flat interfaces 525 and 530 are desirable and thickness of the cladding layer 505 and the dielectric layer 520 needs to be chosen such that the reflected beam is combined with the originally downward diffracted light with the same or very similar phase. Metal surface absorbs light and is not desirable.

A grating does not have to be directly etched into the waveguide layer. FIG. 5B shows an example wherein another InGaAsP layer of the third refractive index 545, above the waveguide layer 510 forms a grating. In this case, the grating height is determined by the thickness of the grating layer and not the etching depth, thus improving the process robustness.

Figure 5C:
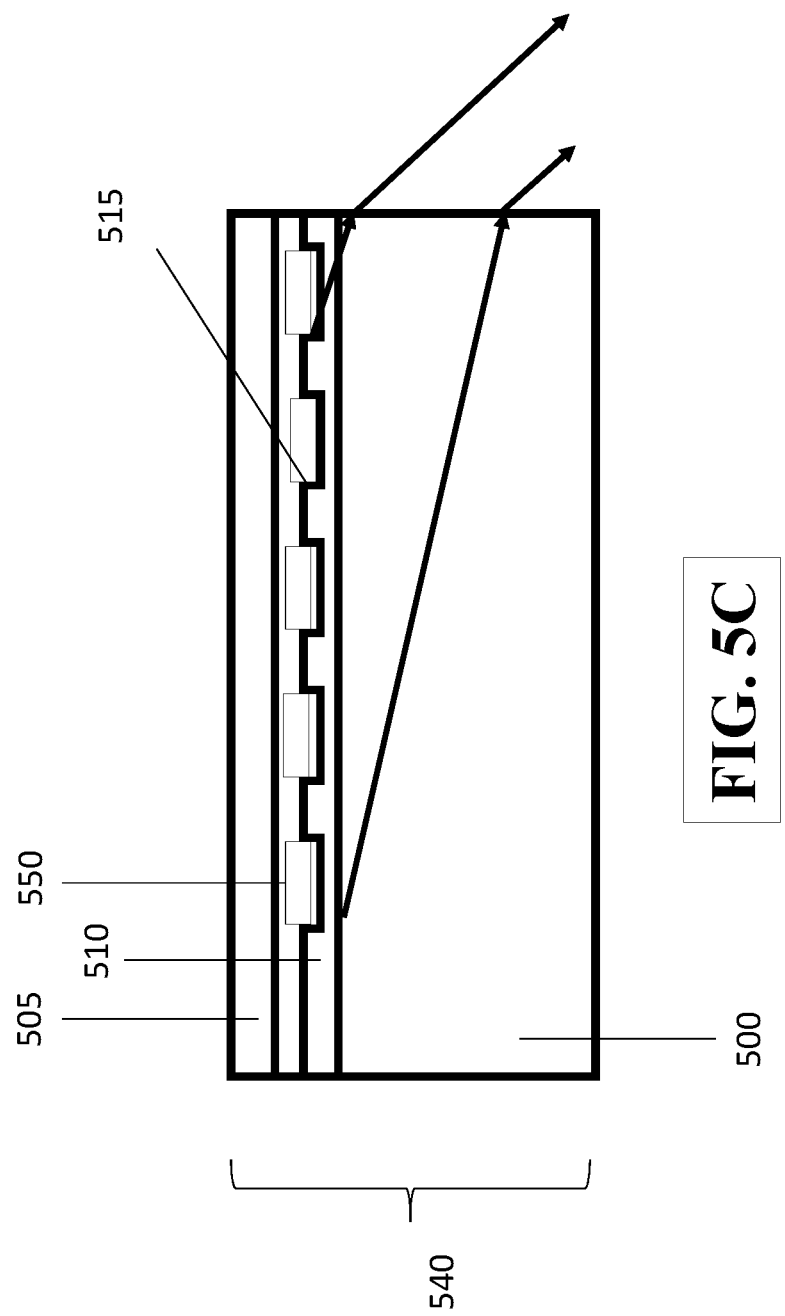
FIG. 5C shows a cross-sectional view of a grating written directly on the waveguide layer and a guide (separate confinement) layer covering the grating.

FIG. 5C shows an example wherein an InGaAsP separate confinement layer 550 of the third refractive index covers the grating etched into the waveguide layer. The refractive index difference between the separate confinement layer 550 and the InGaAsP waveguide layer can be smaller than the case depicted in FIG. 5A, thus improving the process robustness due to less sensitivity to the etch depth.

FIG. 5D shows an example wherein the InP substrate 500 and the InP cladding layer 505 of the first refractive index surrounds the InGaAsP waveguide layer 510 of the second refractive index, which is fully etched into grating segments 555. Since this creates unguided light between the grating segments 555, and mismatch to the guided mode within the grating segment 555 is large, thus creating a very strong grating and is adequate for short length grating region.

Figure 5E:
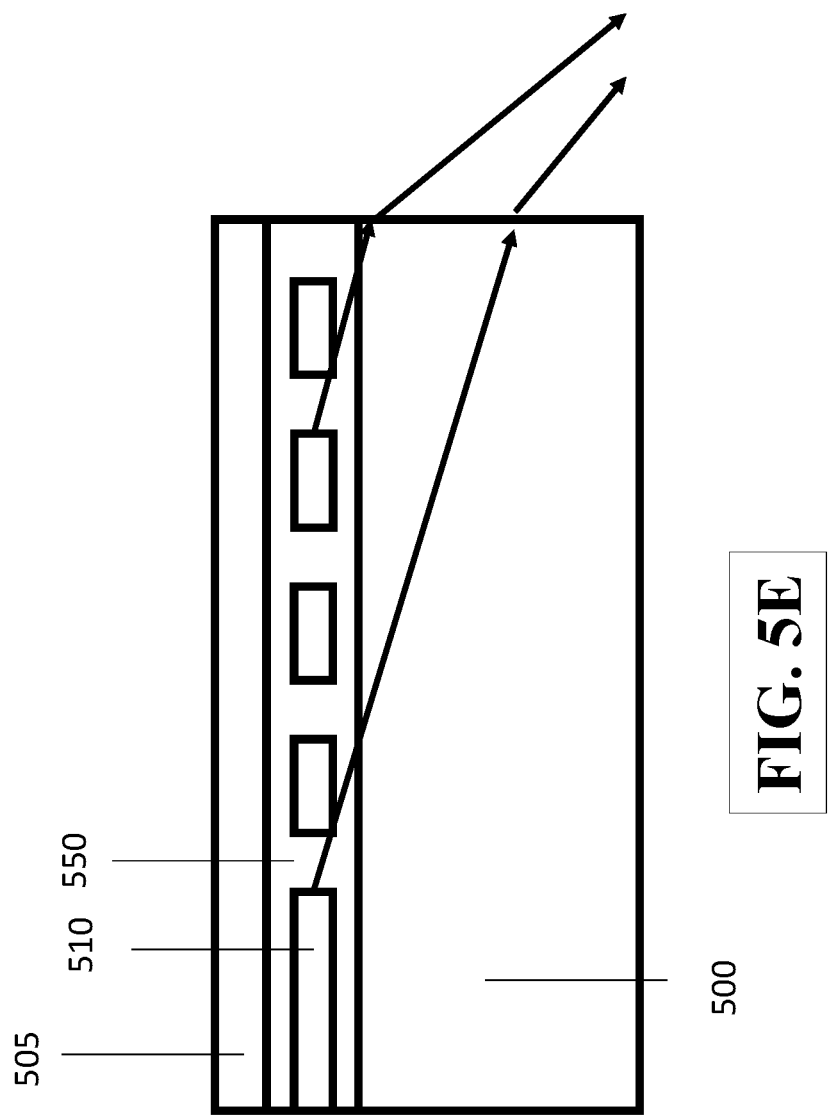
FIG. 5E shows a cross-sectional view of a grating made of separated segments of a waveguide layer embedded in a separate confinement layer.

FIG. 5E shows a case wherein an InP substrate 500 and an InP cladding layer 505 of the first refractive index surrounds an InGaAsP separate confinement layer 550 of the third refractive index, wherein an InGaAsP waveguide layer 510 with the second refractive index is fully etched and is buried. In this case, the optical confinement is mainly determined by the separate confinement layer and the grating strength is determined by the thickness of the waveguide layer, so the emission angle and coupling efficiency is robust to etching process variation.

Figure 6:
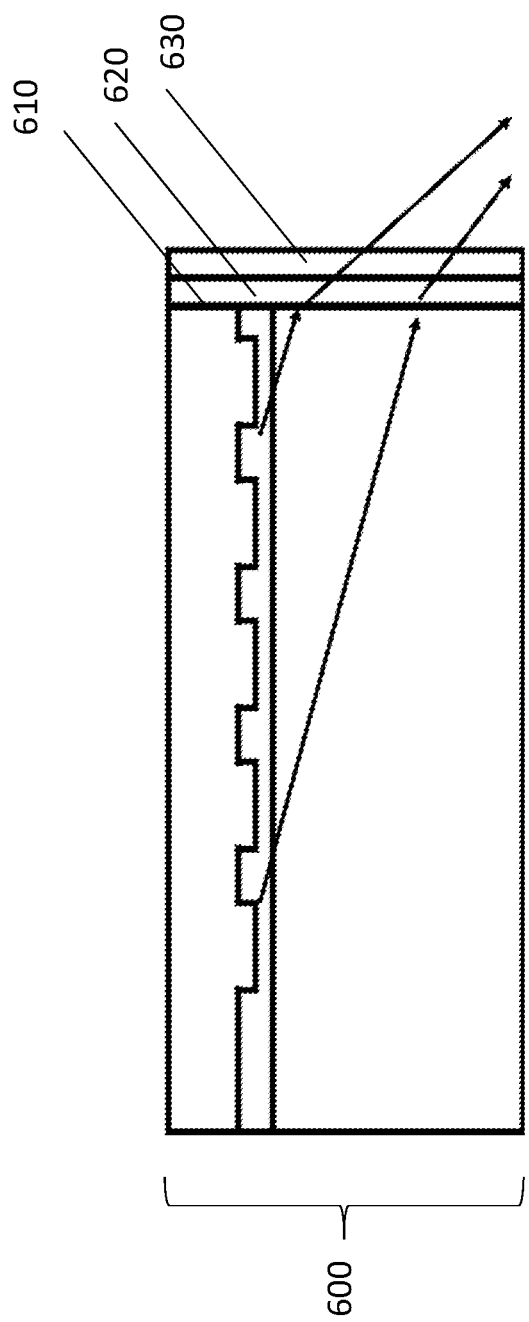
FIG. 6 shows a cross-sectional view of a grating with multiple layers of anti-reflection dielectric films on the facet.

FIG. 6 shows the schematic of a first optical chip 600, comprising of a chip facet 610, the first dielectric film 620, and the second dielectric film 630. The optical beam impinging on the chip facet 610 is not normal to the surface, but is 10° to 20° described above. Therefore, dielectric films 610 and 620 have to be optimized for the incident angle, such as two layers or more.

Figure 7:
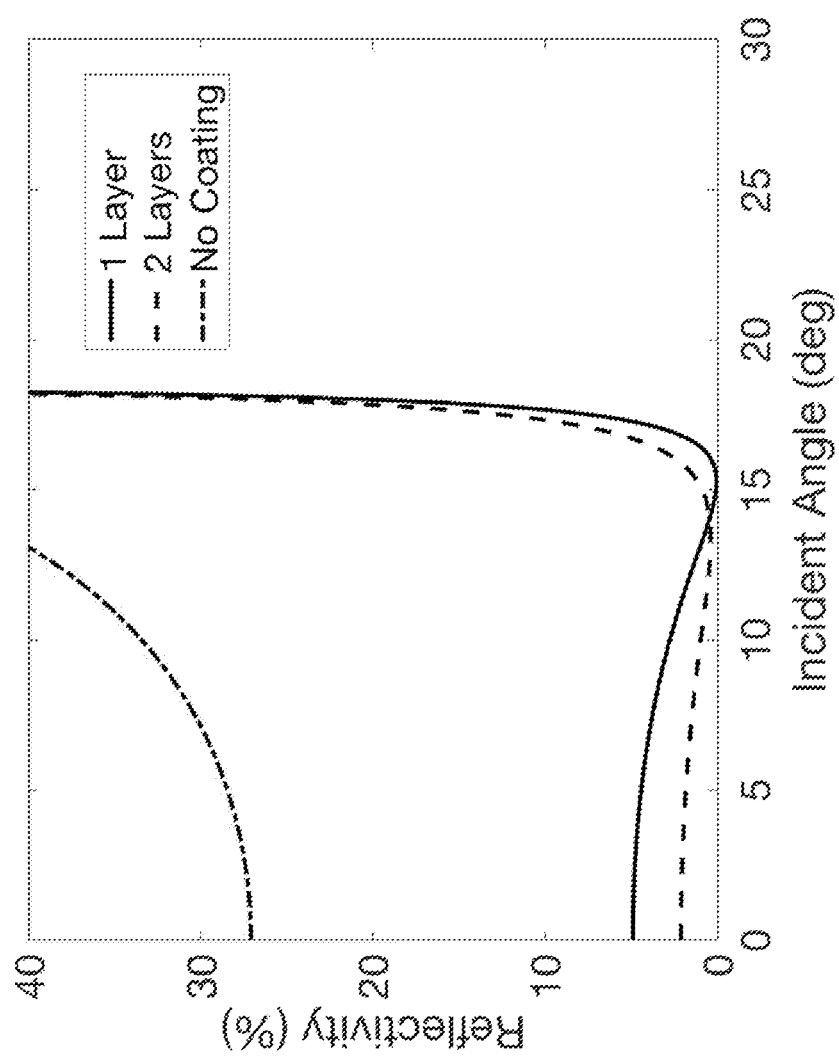
FIG. 7 shows the simulated facet reflectivity as a function of incident angle, wherein no coating, one layer coating ($Si_3N_4$), and two layer coating ($Si_3N_4$ and $SiO_2$ films) are applied.

FIG. 7 shows the calculated transmittance of TE mode input as a function of incident angle, wherein there is one layer ($Si_3N_4$) coating, two layer ($Si_3N_4$ and $SiO_2$), or no coating. The thicknesses of $Si_3N_4$ (first dielectric film) and $SiO_2$ (second dielectric film) are optimized for 15° incident angle. One-layer coating is effective in suppressing reflectivity at a certain angle, while two layer coating is effective in lowering reflectivity in a broad angle range. It is shown that reflectivity increases significantly above 16° incident angle. The exact behavior depends on the coating design, however, it is best to keep the incident angle below ~20°.

The emitted beam diverges in the horizontal direction along the propagation despite of relatively long gratings, typically 50 μm or longer. It is therefore important to use chirped grating, i.e., gradually changing the pitch Λ of the grating along the propagation direction, thereby focusing the beam onto a narrow region of the grating on the second chip.

In order to make the emitted beam closer to the beam shape (such as Gaussian beam) more suitable for coupling into the second grating, the grating strength can be altered along the propagation direction, also called apodized grating.

The emitted beam also diverges in the lateral direction, that is, in the horizontal direction normal to the propagation direction.

One way to narrow the lateral beam divergence is to use curved gratings, such as elliptic grating. FIGS. 8A and 8B show a cross-sectional view and a top of the grating coupler system 800, respectively, wherein the first optical chip 810 and second optical chip 830 have elliptical gratings 820 and 840, respectively. In one example, an InP waveguide 815 with around 1 μm width is connected to the elliptic grating 820 with at least 10° in full width. A silicon waveguide 835 with 0.5 μm width is also connected to an elliptic silicon grating 840.

The most common way is to define elliptic curves is to follow the equation $$q\lambda_0 n_{eff}\sqrt{y^2+z^2}-zn_t \cos\theta_c.$$

Here, z is the coordinate in the propagating direction, y is that in the lateral direction, q is an integer number for each grating line, θ is the angle between the outgoing/incoming light and the chip surface, $n_t$ is the refractive index of the environment, $\lambda_0$ is the vacuum wavelength, and $n_{eff}$ is the effective index felt by the wave in the waveguide with the grating. In the center (y=0), the grating lines are determined by the previously described methods whose cross-sections are described in FIGS. 4 and 5.

Alternatively, we can use tilted grating so that the reflected light will not couple back into the original waveguide. The above equation is derived to generate a circular beam. In this grating coupler system 800, due to the diffraction at the facet, a circular beam becomes an elliptical beam. Therefore, further modification to the grating lines 820 may be desirable to form a near circular beam observed at the grating 840 at the second optical chip.

Figure 9A:
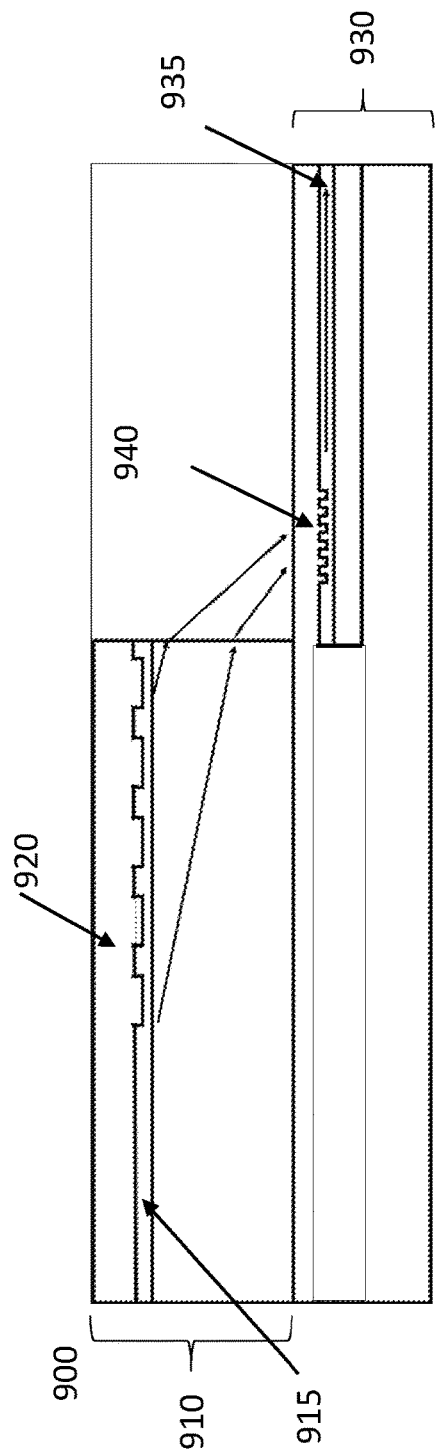
FIG. 9A show the cross-section view of the grating coupler system, where linear gratings are connected to the waveguides through tapered waveguides.
Figure 9B:
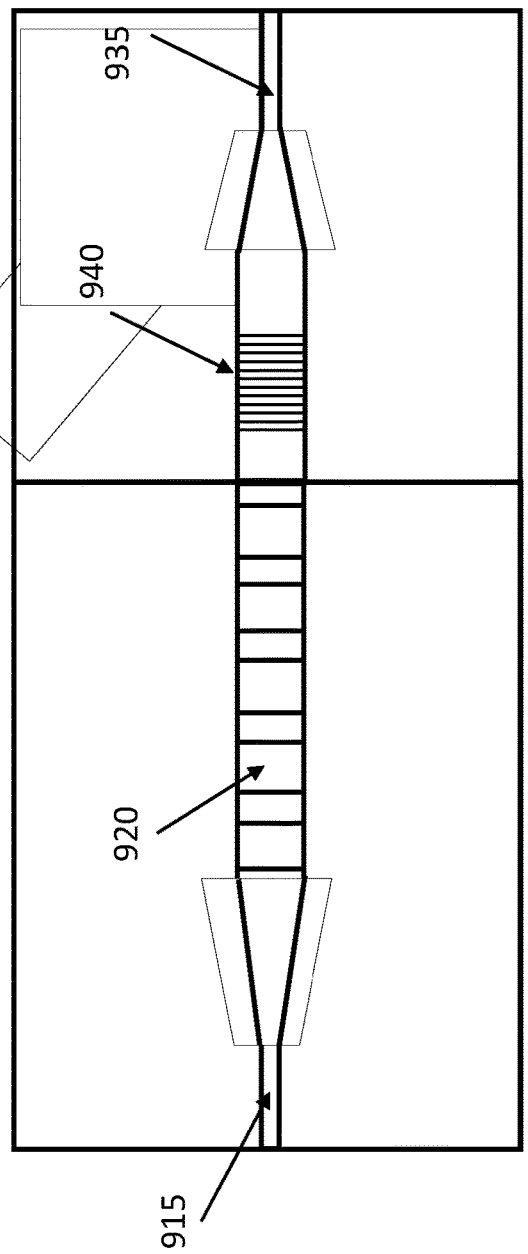
FIG. 9B shows the top view of the grating coupler system of FIG. 9A.

Another way of narrowing the lateral beam divergence is to use tapered waveguide. FIGS. 9A and 9B show a cross-sectional view and a top of the grating coupler system 900, respectively, wherein the first optical chip 910 and second optical chip 930 have elliptical gratings 920 and 940, respectively. In one example, an InP waveguide 915 with ~1 μm width is tapered to the width to 5-20 μm, and then it is connected to a linear InP grating 920, whose cross-section is defined in FIGS. 4 and 5. The length of the taper section can be 5-100 μm. The grating on the second chip 930 can be a linear width grating 940. Alternatively, it can be an elliptical grating 840 such as shown in FIG. 8B.

It is also important to increase the coupling efficiency for the grating in the second chip, typically based on silicon substrate, and silicon waveguide is sandwiched between two $SiO_2$ layers. There are many ways to increase it.
1) Bragg reflector (a pair of layers with different refractive indices) between the silicon substrate and the bottom of the $SiO_2$ layer.
2) Subgrating on at least one side of the main grating teeth.
3) Silicon amorphous layer above the upper $SiO_2$ cladding layer.
4) Metallic layer between the silicon substrate and the bottom of the $SiO_2$ layer.

Alternatively, a $Si_3N_4$ waveguide, sandwiched between two $SiO_2$ layers, can also be used for guiding the incoming light. Also, a $SiO_2$ substrate can be used for the second optical chip In one embodiment of the invention, the grating coupler system 1000 can comprise of a first optical chip with a waveguide 1020 and a grating 1050 connected to a gain region 1035 comprising of an active layer 1030 such as a multi quantum well (MQW) structure (FIGS. 10A and 10B). MQW structure is a very efficient gain medium. The light generated or amplified in the gain region 1035 through a current injection provided by the electrode 1040 can be guided to the grating coupler 1050 to be coupled to the second optical chip 1060. The gain region can also be part of a DFB or a DBR laser, wherein the laser light is generated. In this case, a substrate of DFB or a DBR laser may be identical to the substrate of the grating coupler system 1000.

FIGS. 11A and 11B show a cross-sectional view and a top of a tunable laser based on an integrated grating coupler system 1100, respectively, wherein the first optical chip 1110 and second optical chip 1150 form the laser cavity. In this case, a wavelength selective reflector 1115, whose refractive index is controlled by temperature or injected carrier through the first electrode 1120, an active section 1125 comprising of an MQW structure with current injected through the second electrode 1130, a grating coupler 1135, and a third electrode 140 are on a first optical chip 1110, formed on a substrate made of materials such as InP, GaAs, or GaN. A second optical chip 1150 comprises of a silicon substrate, BOX layer 1155, silicon and/or silicon nitride waveguide 1160, a grating coupler 1165, and a wavelength selective reflector 1170 whose refractive index can be controlled by temperature or injected carrier through a second pair electrodes 1175 and 1185. A phase controller can be on either chip. In FIG. 11B, a ring resonator is depicted as an example of a wavelength selective mirror, however, it can also be a sampled grating distributed Bragg reflector. These wavelength selectable mirrors have multiple reflection peaks, wherein the peak wavelengths can be tuned by the injected current, applied reverse bias voltage, or temperature controlled by a heater.

According to aspects of integrated grating coupler system described above, with respect to the integrated grating coupler system, a ratio w/Λ between the line width w and the pitch Λ over can be arranged to be approximately 0.5 for reducing a second order diffraction of the light beam from the grating structure.

Further, a dielectric film may be arranged on the cladding layer, and the substrate of the first chip may be an InP substrate. Also in some cases, the substrate of the second chip can be a Si substrate, the second chip may include a Si waveguide, and the first wavelength selectable reflector may include a sampled grating Bragg reflector.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A grating coupler having first and second ends for coupling a light beam to a waveguide of a chip comprising:
    a substrate configured to receive the light beam from the first end and transmit the light beam through the second end, the substrate having a first refractive index n1;
    a grating structure having grating lines arranged on the substrate, the grating structure having a second refractive index n2, wherein the grating lines have line width w and height d and are arranged by a pitch Λ, wherein the second refractive index n2 is greater than first refractive index n1, wherein the grating structure is configured to maintain a diffraction angle of the light beam from the second end in a range between 33 degree and 90 degree; and
    a cladding layer configured to cover the grating structure, wherein the cladding layer has a third refractive index n3, wherein the third refractive index n3 is less than the second refractive index n2, wherein the cladding layer is arranged so as to reflect the light beam diffracted from the grating structure toward below the cladding layer.

2. The grating coupler of claim 1, wherein the grating structure further includes a waveguide layer to form a grating geometry connecting the grating lines on the waveguide layer, wherein the waveguide layer having a thickness d is arranged on the substrate.

3. The grating coupler of claim 2, wherein the grating structure further includes sub-gratings having line width w2 and the height d and a second pitch Λ2, wherein the pitch Λ is greater than the second pitch Λ2, wherein the sub-gratings are arranged on at least one side of each of the grating lines.

4. The grating coupler of claim 1, wherein the pitch Λ is changed from the first end to the second end to focus the light beam on the waveguide of the chip according to a function of distances.

5. The grating coupler of claim 1, wherein a ratio w/Λ between the line width w and the pitch Λ over is arranged to be approximately 0.5 for reducing a second order diffraction of the light beam from the grating structure.

6. The grating coupler of claim 1, further comprising an end anti-reflection film arranged on the second end.

7. The grating coupler of claim 6, wherein the end anti-reflection film consists of at least two layers with different materials.

8. The grating coupler of claim 1, further comprising a dielectric film arranged on the cladding layer.

9. The grating coupler of claim 1, wherein the third refractive index n3 of the cladding layer is approximately the same as the first refractive index n1 of the substrate.

10. The grating coupler of claim 1, further comprising a second cladding layer arranged between the grating structure and the cladding layer, wherein the second cladding layer has a fourth refractive index n4, wherein the fourth refractive index n4 is less than the third refractive index n3.

11. The grating coupler of claim 1, wherein the grating lines are elliptic grating lines arranged to focus the light beam to the waveguide of the chip.

12. The grating coupler of claim 1, further comprising a second waveguide layer arranged on the substrate, wherein the grating lines of the grating structure are separately arranged above the second waveguide layer and burred in the cladding layer.

13. The grating coupler of claim 1, wherein the grating lines of the grating structure are separately arranged between the substrate and the cladding layer.

14. The grating coupler of claim 1, wherein the substrate is an InP substrate.

* * * * *